United States Patent
Roffmann et al.

[11] Patent Number: 6,118,274
[45] Date of Patent: Sep. 12, 2000

[54] RADIO-FREQUENCY COIL FOR MAGNETIC RESONANCE IMAGING AND SPECTROSCOPY

[75] Inventors: Wolfgang Udo Roffmann, Coorparoo; Kurt Luescher, Indooroopilly; Stuart Crozier, Wilston; David Michael Doddrell, Westlake, all of Australia

[73] Assignee: University of Queensland, St. Lucia, Australia

[21] Appl. No.: 09/127,961

[22] Filed: Aug. 3, 1998

[51] Int. Cl.⁷ .................................................. G01V 3/00
[52] U.S. Cl. ........................................... 324/321; 324/318
[58] Field of Search .................................. 324/321, 322, 324/318, 319, 320, 300, 307, 309

[56] References Cited

U.S. PATENT DOCUMENTS

| | | | |
|---|---|---|---|
| 4,517,516 | 5/1985 | Hill et al. | 324/318 |
| 5,760,586 | 6/1998 | Foerster et al. | 324/321 |
| 6,008,650 | 12/1999 | Behbin | 324/318 |

FOREIGN PATENT DOCUMENTS 0177855  4/1986  European Pat. Off. .

*Primary Examiner*—Louis Arana
*Attorney, Agent, or Firm*—Paul Vincent

[57] ABSTRACT

An NMR probehead is proposed having a generally cylindrical casing extending along a probehead axis. The NMR probehead can be inserted into the room temperature bore of an NMR spectrometer magnet providing, in a measurement region, a homogeneous static magnetic field along the probehead axis. The NMR probehead comprises a cylindrical radio frequency (RF) resonator oriented along a resonator axis and generating essentially homogeneous RF magnetic fields transverse to the resonator axis. In accordance with the invention, the angle between the probehead axis and the resonator axis is different from 0°. In this manner, the inclination of the resonator does not affect the useful RF magnetic field and the signal to noise ratio of the received NMR signal is independent of the inclination angle.

22 Claims, 13 Drawing Sheets

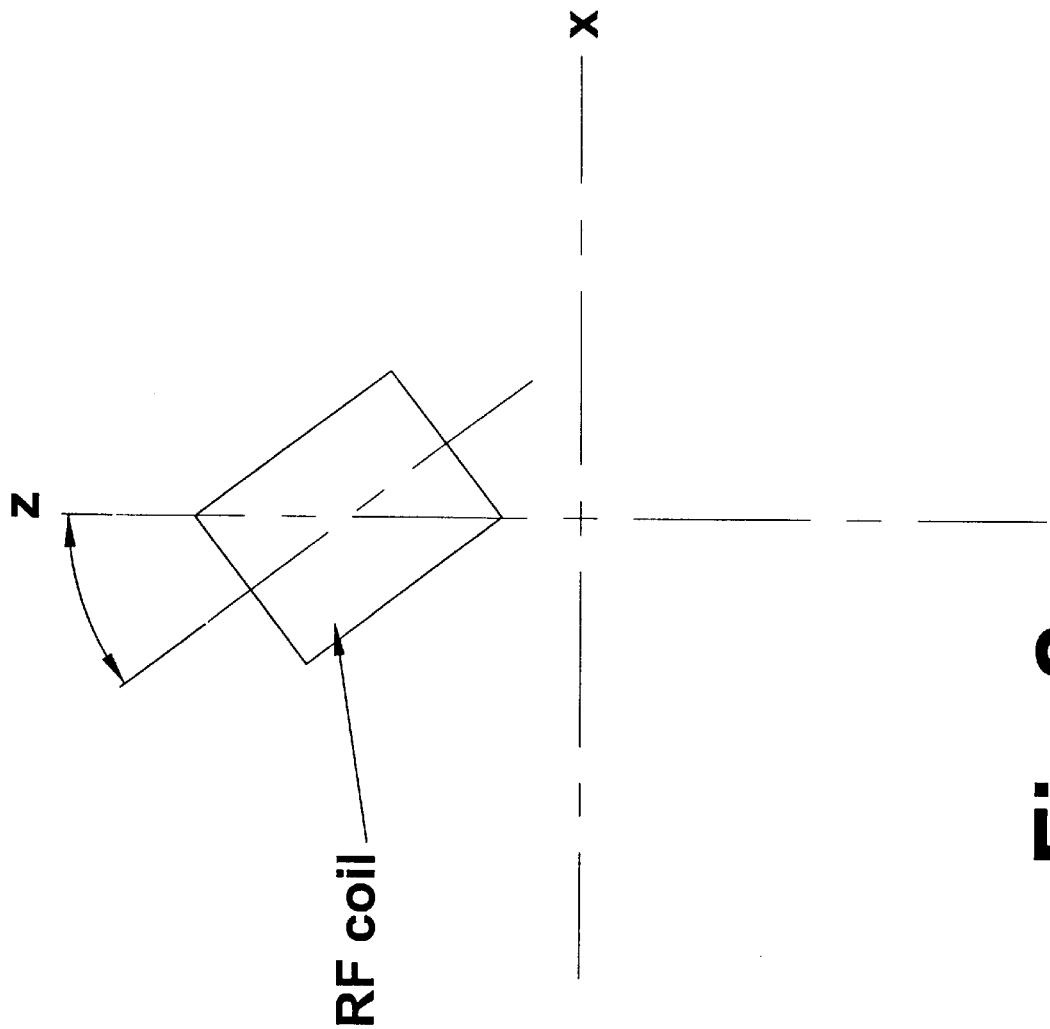

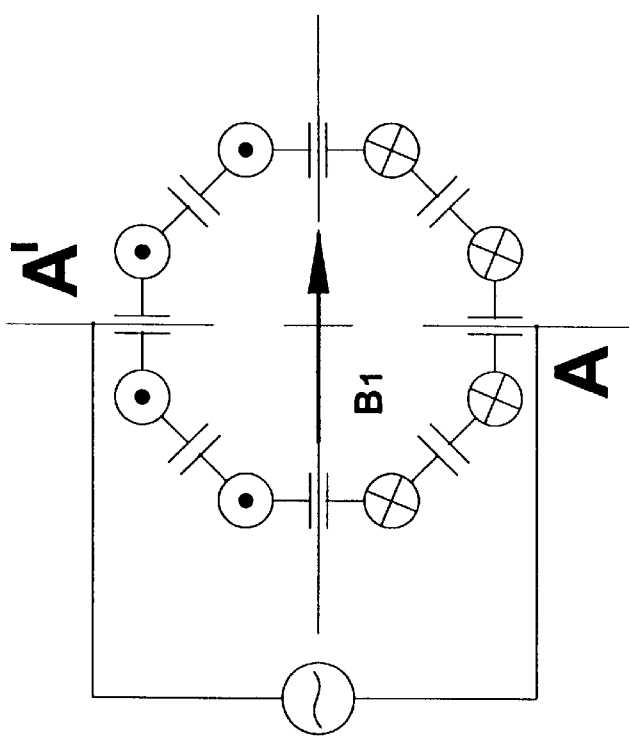

RADIO-FREQUENCY COIL FOR MAGNETIC RESONANCE IMAGING AND SPECTROSCOPY

BACKGROUND OF THE INVENTION

This invention relates to radio-frequency (RF) antennae used in Nuclear Magnetic Resonance (NMR) apparatus. More specifically, the antennae are housed in a generally tubular structure and act to irradiate the sample with RF energy and/or receive NMR signals from the sample.

The relationship relating angular precession and the static magnetic field $B_0$ in NMR is $$\omega = \gamma B_0$$

the Larmor equation
where $\omega$ is the precessional angular velocity, $B_0$ is the static magnetic field (consisting of the applied homogeneous field and other fields) and $\gamma$ is the gyromagnetic ratio, which is constant for a particular isotope. Thus different isotopes precess at different angular frequencies. The Larmor equation applies to the situation where an ensemble of nuclei possessing nuclear spin are subjected to a strong static magnetic field. A number of possible energy levels are established by the application of $B_0$ and its interaction with the magnetic moments of the nuclear spins.

If RF energy is applied at the appropriate Larmor frequency, and in a direction orthogonal to $B_0$, the population in each energy state will change, leading to a net imbalance in the populations of energy levels. After cessation of the RF energy, the system will attempt to return to its state before RF excitation and in doing so will emit RF energy at the Larmor frequency. This is the NMR signal and may be detected by the same RF coil that irradiated the sample or by different receiver antenna. In NMR, the RF antennae are generally tuned to the desired frequencies, provide homogeneous RF excitation/reception of the sample orthogonal to the static magnetic field and are desirably efficient in operation. Of principal interest are the RF magnetic fields generated by the antenna and these are often termed the $B_1$ fields in NMR.

Of particular interest in NMR is the use of resonant structures (resonators) such as those known in the art from, for example, EP 0 177 855 B 1. These structures generate essentially homogeneous $B_1$ fields transverse to $B_0$. In this transverse plane two essentially homogeneous magnetic field modes are generated in orthogonal spatial directions.

In certain NMR experiments, it is advantageous to incline the sample and the resonator at an angle to the static magnetic field, rather than having the axes of the sample, resonator and main magnet co-incident. A particular case is where the angle of inclination is $\cos^{-1}(1/\sqrt{3})$ degrees and the sample is rotated (spun) around this tilted axis; this has the effect of removing chemical shift anisotropy and averaging out the effect of dipolar couplings in the sample. This is well known in the art of the NMR of solids (see for example "High Resolution NMR in the Solid State", E. O. Stejskal and J. D. Memory, Oxford University Press, 1994) and is also used in liquid state NMR in an attempt to remove inhomogeneous broadening effects.

Prior art probes that contain RF coils tilted from the $B_0$ axis use coils that generate RF magnetic fields along the coil axis, such as solenoidal wound structures. These coils suffer from a loss in efficiency in generating NMR useful RF magnetic fields when inclined to the static field $B_0$ therefore, by reciprocity, also suffer a reduction in signal to noise ratio (SNR) of the received NMR signal. At an inclination of $\cos^{-1}(1/\sqrt{3})$ degrees, the reduction in the magnitude of the NMR useful RF magnetic field is approximately 18% for fixed power input. A further form of NMR experiment requires that the inclination angle be altered during the course of the experiment. Prior art probes require a re-calibration of the 90 degree pulse time (i.e. the rectangular envelope RF pulse duration for maximum signal return in a simple one-pulse experiment) at each angle.

It is an object of this invention to provide an RF resonator that provides a substantially homogeneous RF field transverse to its resonator axis, said resonator axis being inclined away from the axis of the static magnetic field $B_0$.

It is a preferred object of this invention to provide an inclined resonator that has one RF mode oriented along the resonator's pivotal axis such that the inclination of the resonator to the $B_0$ field does not affect the useful RF magnetic field generated by the resonator and such that the SNR of the received NMR signal for a fixed rf power input does not change with inclination angle.

SUMMARY OF THE INVENTION

In accordance with the invention, a generally tubular resonator structure generating RF magnetic fields transverse to its axis is inclined to the static magnetic field and one of the generated RF magnetic field modes is aligned so that the inclination angle has no effect on the RF efficiency of the resonator. In accordance with the invention, recalibration of the 90° pulse is not required.

In a broad form, the invention provides an improved probe for "tilted-angle" operation in an NMR apparatus, the probe comprising a generally tubular member having a plurality of circumferentially spaced axial conductors, the conductors may be connected to adjacent conductors at each end point by capacitive elements or alternatively the axially conductors may be interrupted by capacitive elements and the axial conductors conductively connected to adjacent conductors at each end. The tubular member and ancillary components serve as the RF resonator.

In a first aspect of the invention the resonator is tilted or inclined from the static magnetic field axis and the selected magnetic field mode is oriented along the pivotal axis of the resonator so that the RF magnetic field of this mode is always orthogonal to $B_0$ and therefore the RF characteristics of the apparatus are inclination angle independent.

In another aspect of the invention the resonator is characterized in that each rung may be of different width to its neighbouring rungs and that the centre of the rungs may not be equally spaced around the periphery, thereby providing an ideal current density and large modal frequency separation, allowing the generation of homogeneous transverse RF magnetic fields.

In yet another aspect of the invention the resonator may generate concurrent linear modes that operate at different frequencies by providing small tuned (tank) circuits around the capacitive elements, effectively double-tuning the resonator.

In yet another aspect of the invention the resonator may be combined with a solenoidal RF coil to generate a circularly polarized RF magnetic field.

In order that the invention may be more fully understood and put into practice, a preferred embodiment thereof will now be described with reference to the accompanying drawings.

BRIEF DESCRIPTION OF THE DRAWING

FIG. 2 illustrates the inclination of the resonator to the probehead axis;

FIG. 3b shows a simplified equivalent circuit diagram corresponding to FIG. 3a;

FIG. 4b shows a cut view in accordance with line A-A' of FIG. 4a also illustrating how the resonator is driven by an RF source according to one embodiment of the invention;

FIG. 6b shows the resultant field distribution inside the resonator corresponding to the current density of FIG. 6a;

DESCRIPTION OF THE PREFERRED EMBODIMENT

Figure 1:
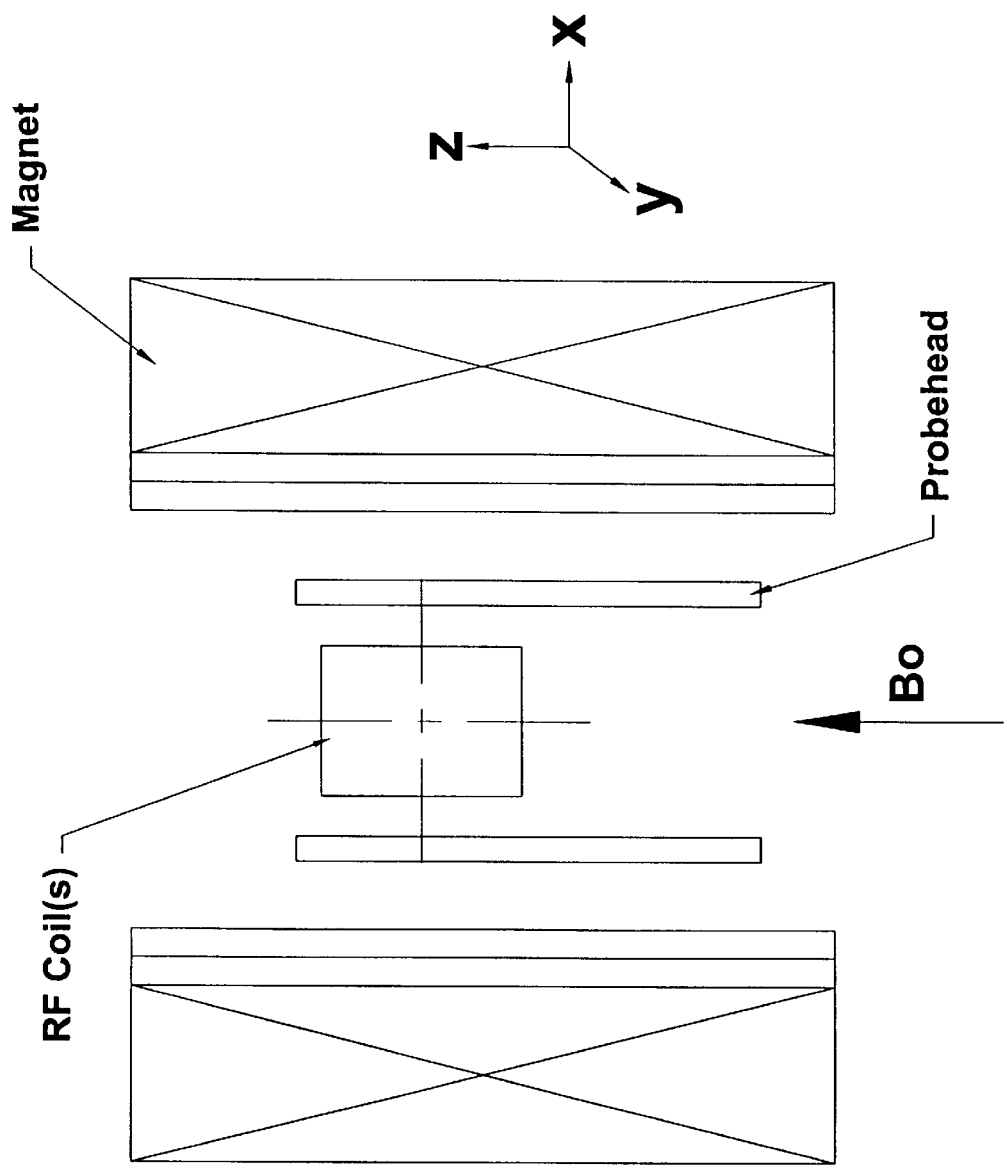
FIG. 1 illustrates the general structure of the NMR equipment in and around the main magnet which generates the static magnetic field $B_0$. The probehead axis is shown aligned with the resonator axis for conventional experimentation.

The standard position and arrangement of an RF coil relative to the NMR magnet apparatus is shown schematically in FIG. 1, where the axis of the RF coil(s), the probehead and the magnet system are shown to be co-incident. FIG. 2 illustrates the case where the RF coil is inclined to the probehead and $B_0$ field direction axis as is generally known in the art relating to solid state NMR.

One form of an RF coil or resonator consists of a number of conducting elements distributed around the periphery of a generally tubular structure. In order to generate a homogeneous transverse RF magnetic field, it is necessary to establish an integrated current distribution of current parallel the resonator axis such that, for circular cross-section resonators, the integrated current varies as sinusoid of the angle around the periphery. This is discussed in prior art U.S. Pat No. 4,694,255 and EP 0 177 855 B1 the disclosure of which are herein incorporated by reference.

Figure 3A:
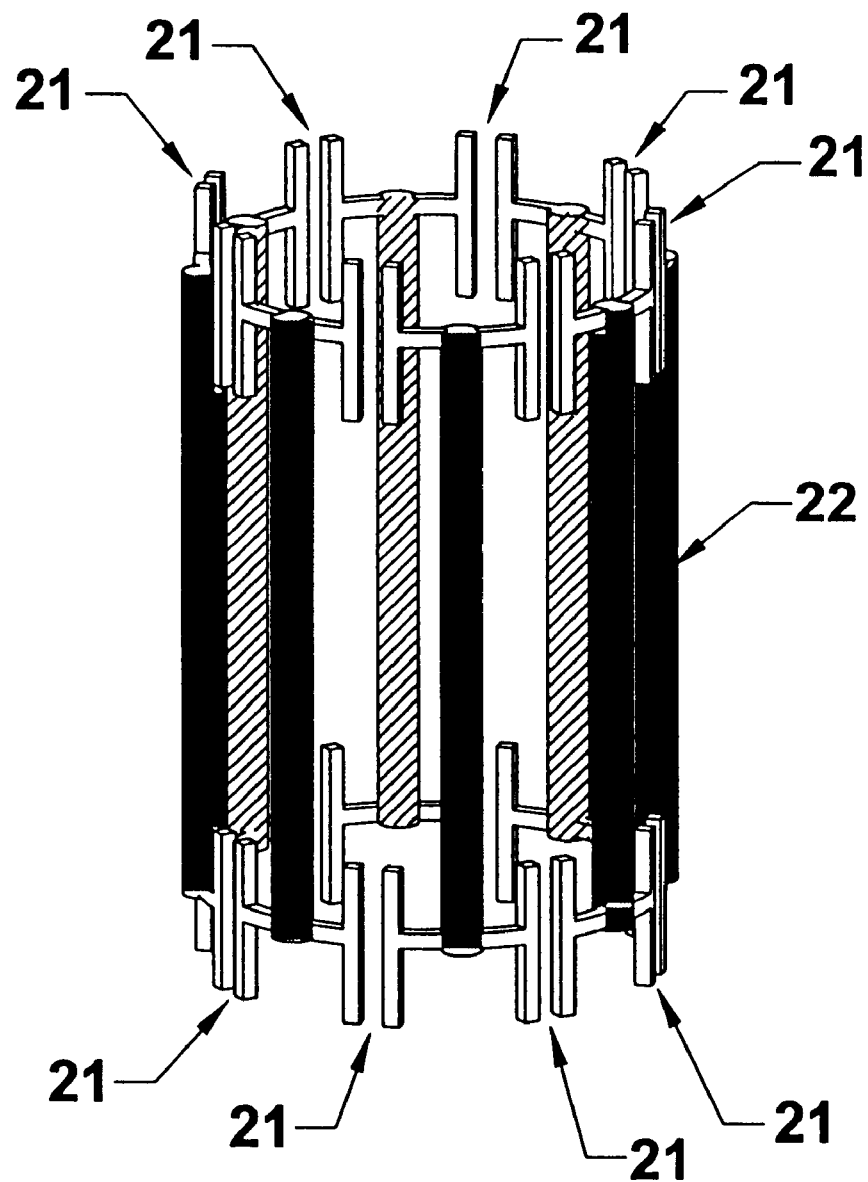
FIG. 3a illustrates the prior art structure of a resonator in high-pass configuration.
Figure 3B:
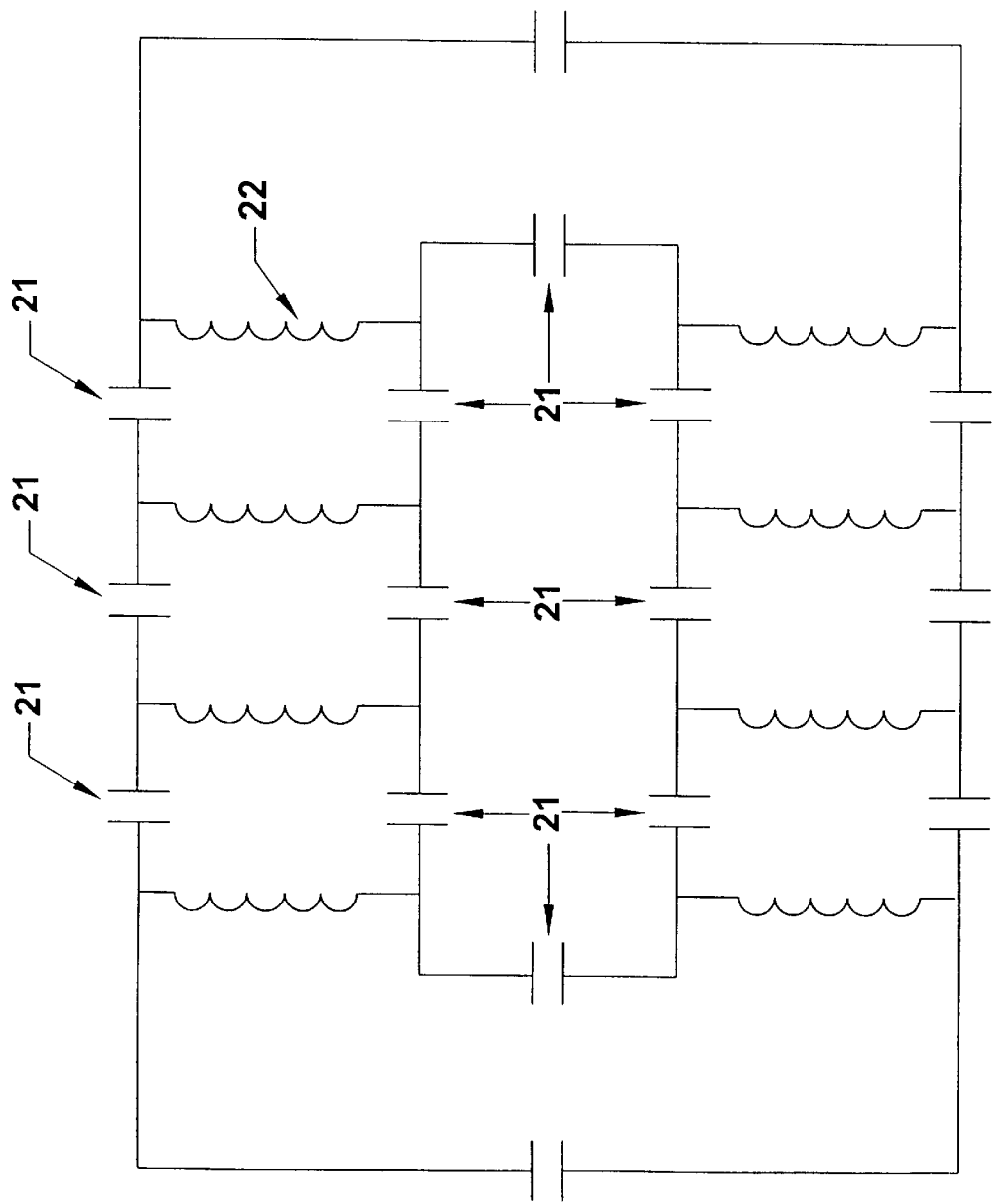
Figure 4A:
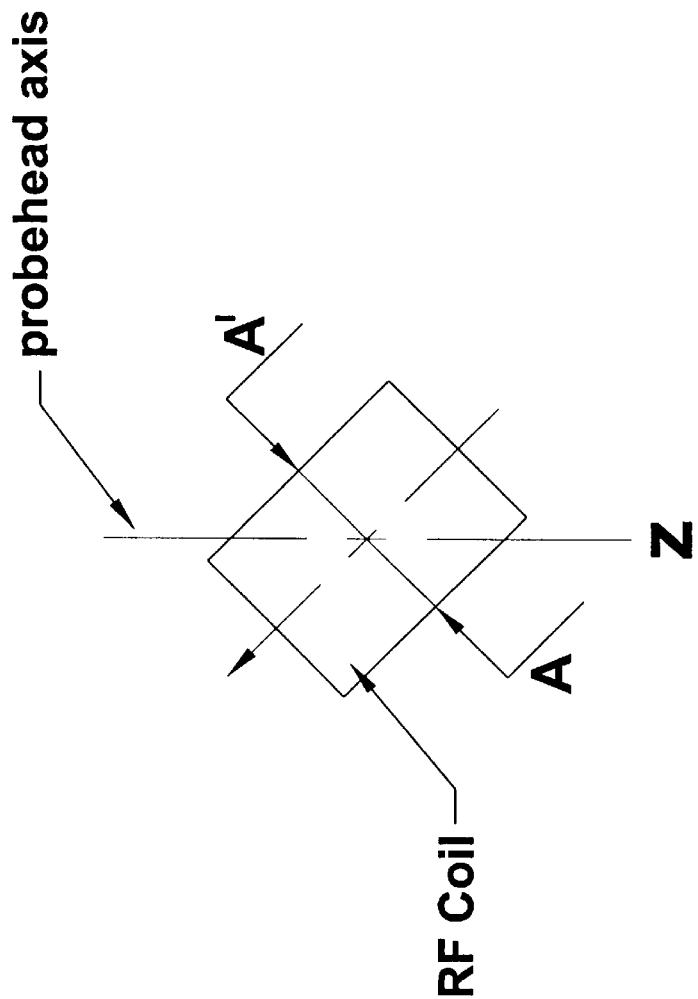
FIG. 4a shows a side view of the orientation of the RF coil in accordance with the invention.

Typically, this current distribution is established by creating a standing wave around the periphery of the coil by separating each rung at its end-points by a capacitor or by interrupting each rung by a capacitor, as shown in the conventional configuration of FIGS. 3a, 3b and in the configuration in accordance with the invention in FIGS. 4a, 4b. The conducting rungs 22 carry the longitudinal RF current, and capacitors 21 act to tune the resonator and establish the standing wave. These are commonly termed "birdcage" resonators. The combination of capacitors 21 and rungs 22 provides a tuned circuit and may be structured to provide high-pass or low-pass operation or a combination of these in band-pass mode as discussed in The Journal of Magnetic Resonance, 63, 622 (1985). Resonators of this type generate many resonant modes when excited by an RF power source. Only two modes are of interest in most NMR experiments, these are modes that produce generally homogeneous transverse magnetic fields orthogonal to each other. If both modes are to be used and combined, a circularly polarised RF field results. If only one mode is to be used then linear polarization results.

Conventional probes used for experiments where the sample is inclined to the probehead axis use RF coils where the RF magnetic field is generated along the coil axis and thus the component orthogonal to $B_0$ varies as the sinusoid of the inclination angle. The SNR therefore changes with inclination angle.

In this invention, the resonator is inclined away from the probehead axis and is designed such that only one mode is used. This mode is selected such that the amplitude of the RF magnetic field orthogonal to the static magnetic field $B_0$ does not vary with inclination angle for a fixed RF power input, unlike conventional designs. This is highly advantageous in some NMR experiments as it means that no readjustment of the RF power is required to produce maximum NMR signal as the inclination angle changes. By reciprocity, this implies that the Signal-to-Noise Ratio (SNR) of the NMR experiment is then invariant to the inclination angle. In order for this improvement to be realised, the correct linear mode must be selected, this is essentially achieved by feeding the coil structure orthogonal to the desired linear mode. In a preferred embodiment, the desired linear mode is directed along the pivotal axis of the RF coil as illustrated in FIGS. 4a and 4b where the driving axis and direction of useful $B_1$ field are shown relative to the resonator structure. This driving arrangement ensures that the mode which is invariant to resonator rotation or inclination is the excited mode.

Figure 5:
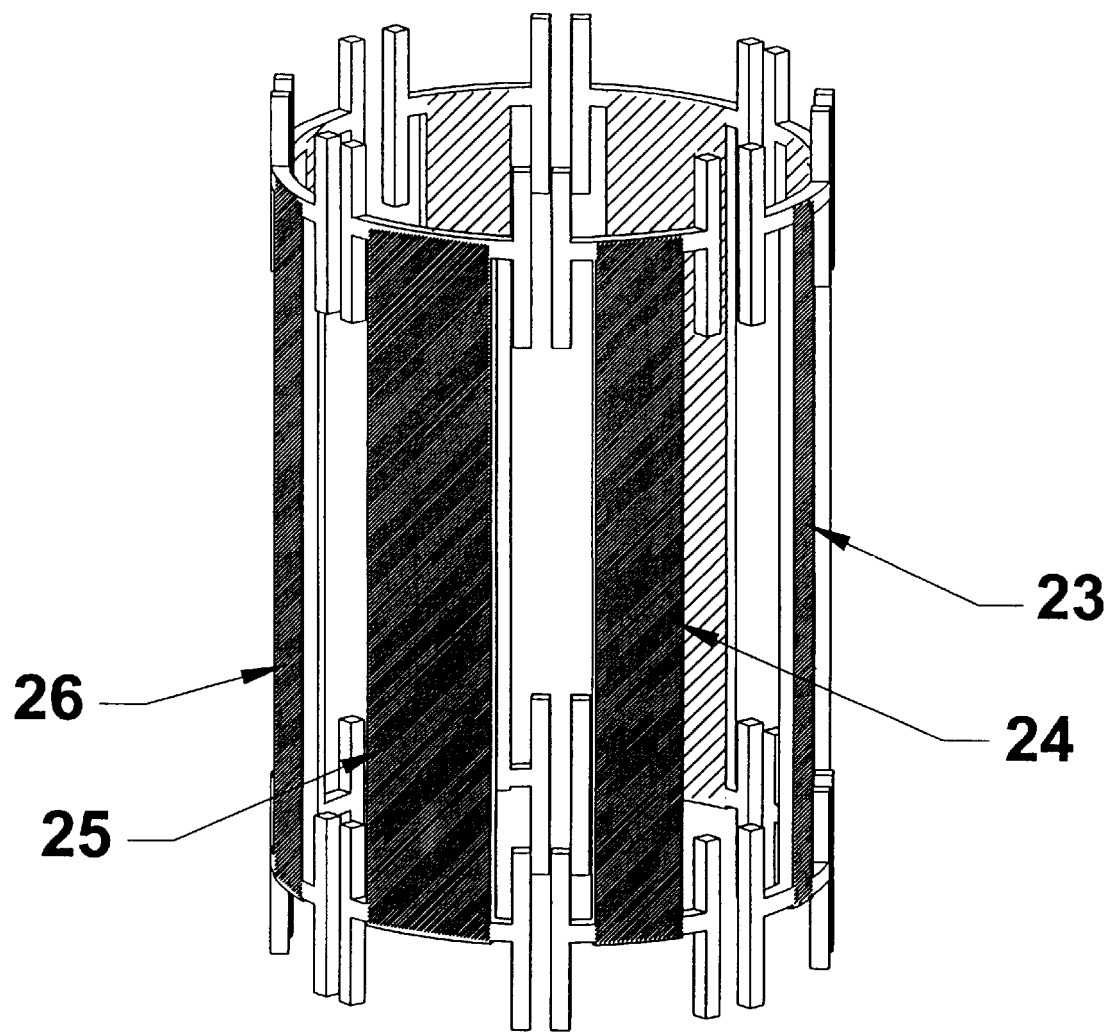
FIG. 5 illustrates the structure of one embodiment of the invention where the rung width is varied between adjacent rungs.
Figure 6A:
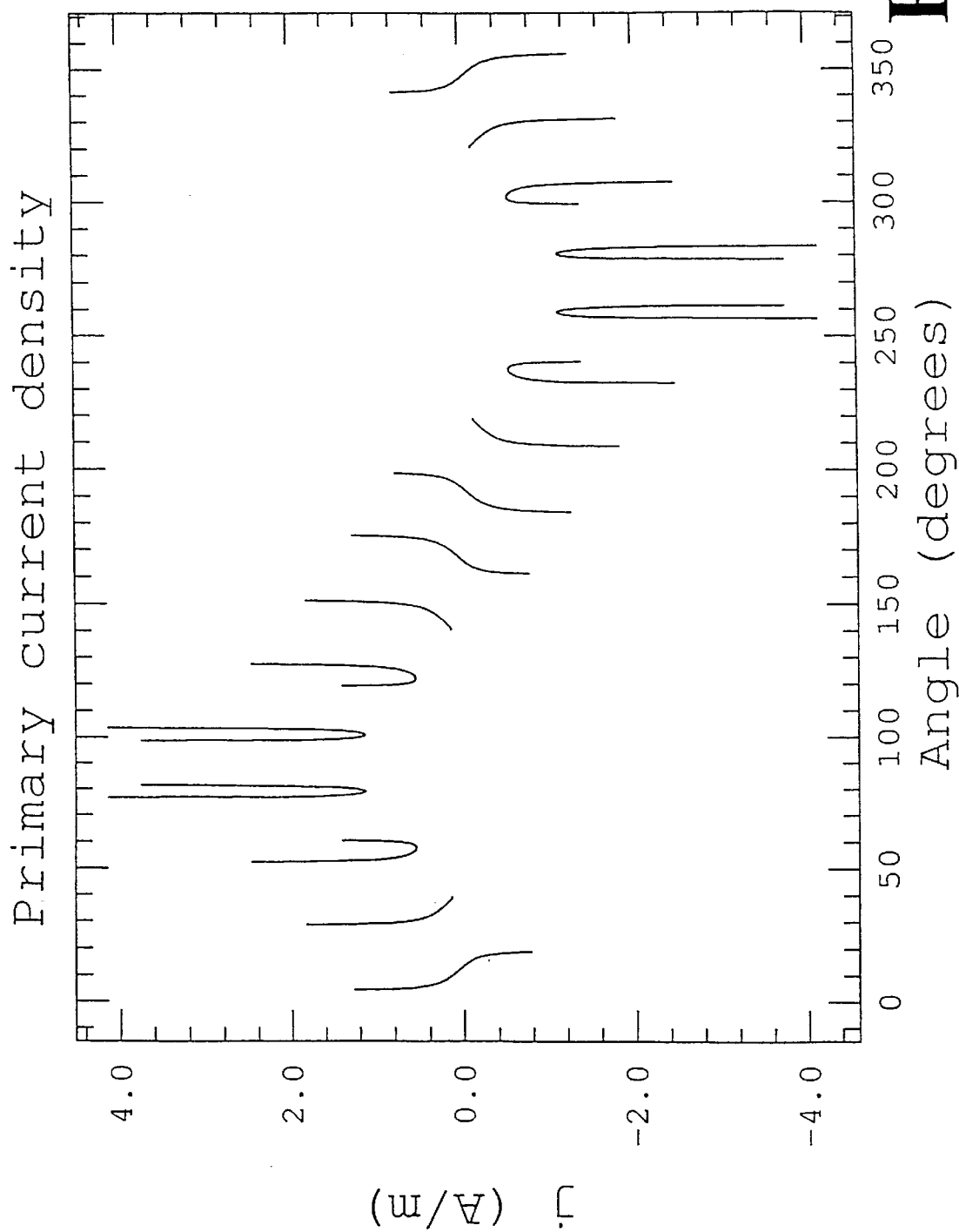
FIG. 6a shows the current density on the primary rungs of a variable strip resonator.

Due consideration must then be given to ensuring that the second mode does not interfere with the desired mode. In a further embodiment of this invention this modal interference is avoided by the use of variable strip rungs, such that each adjacent rung has a different width. This produces a wide frequency separation of the two useful homogeneous modes and provides a highly homogeneous desired mode. A more conventional method for frequency separating the modes is to use different capacitor values in certain positions around the periphery as is described in (P. M. Joseph and D. Lu, IEEE. Trans. Med. Imag. 8, 286 (1989))—however, this reduces the homogeneity of the RF magnetic field. The advantage of the variable strip embodiment is that it is able to provide wide modal separation and maintain highly homogeneous RF magnetic field generation. FIG. 5 illustrates the variable strip concept where conducting rungs 23–26 each have a different width. The selection of these widths is based on a numerical optimization to provide the appropriate current density for a homogeneous transverse magnetic field generation and a selection for the desired resonance frequency. To illustrate the effect on specific coil designs we have designed and constructed resonators with apertures of 64 mm and 6 mm respectively, both of which operate at 300 MHz. FIG. 6a shows the expected current density on the primary rungs of the 64 mm aperture variable strip resonator where the rung angles on the primary coil were:

| Rung # | centre angle (°) | angular width (°) |
|---|---|---|
| 1 | 11.5 | 15 |
| 2 | 33.5 | 11 |
| 3 | 56.5 | 8.5 |
| 4 | 79.0 | 5 |
| 5 | 101 | 5 |
| 6 | 123.5 | 8.5 |
| 7 | 146.5 | 11 |
| 8 | 168.5 | 15 |
| 9 | 191.5 | 15 |
| 10 | 213.5 | 11 |
| 11 | 236.5 | 8.5 |
| 12 | 259 | 5 |
| 13 | 281 | 5 |
| 14 | 303.5 | 8.5 |
| 15 | 326.5 | 11 |
| 16 | 348.5 | 15 |

Figure 6B:
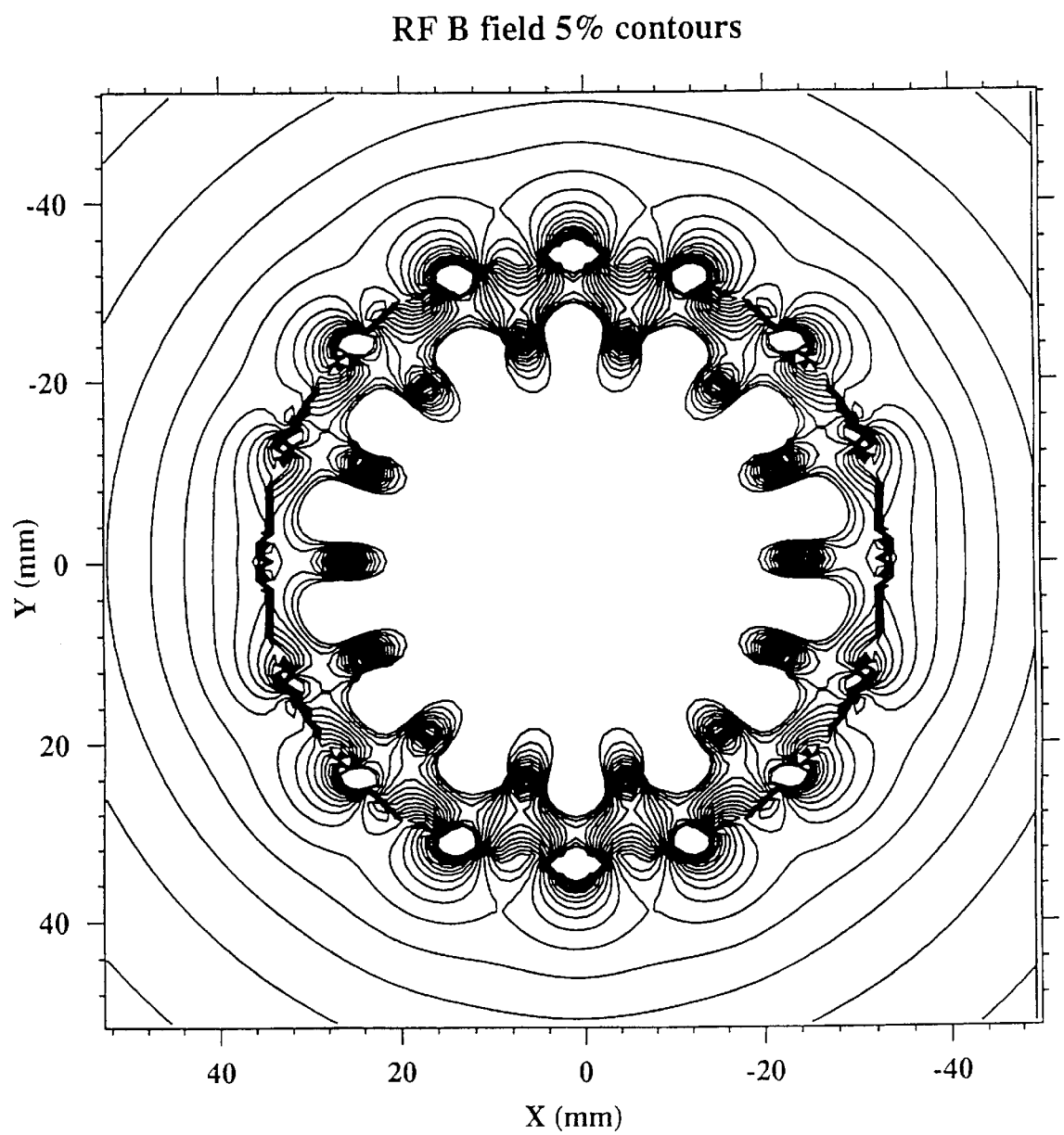
Figure 7:
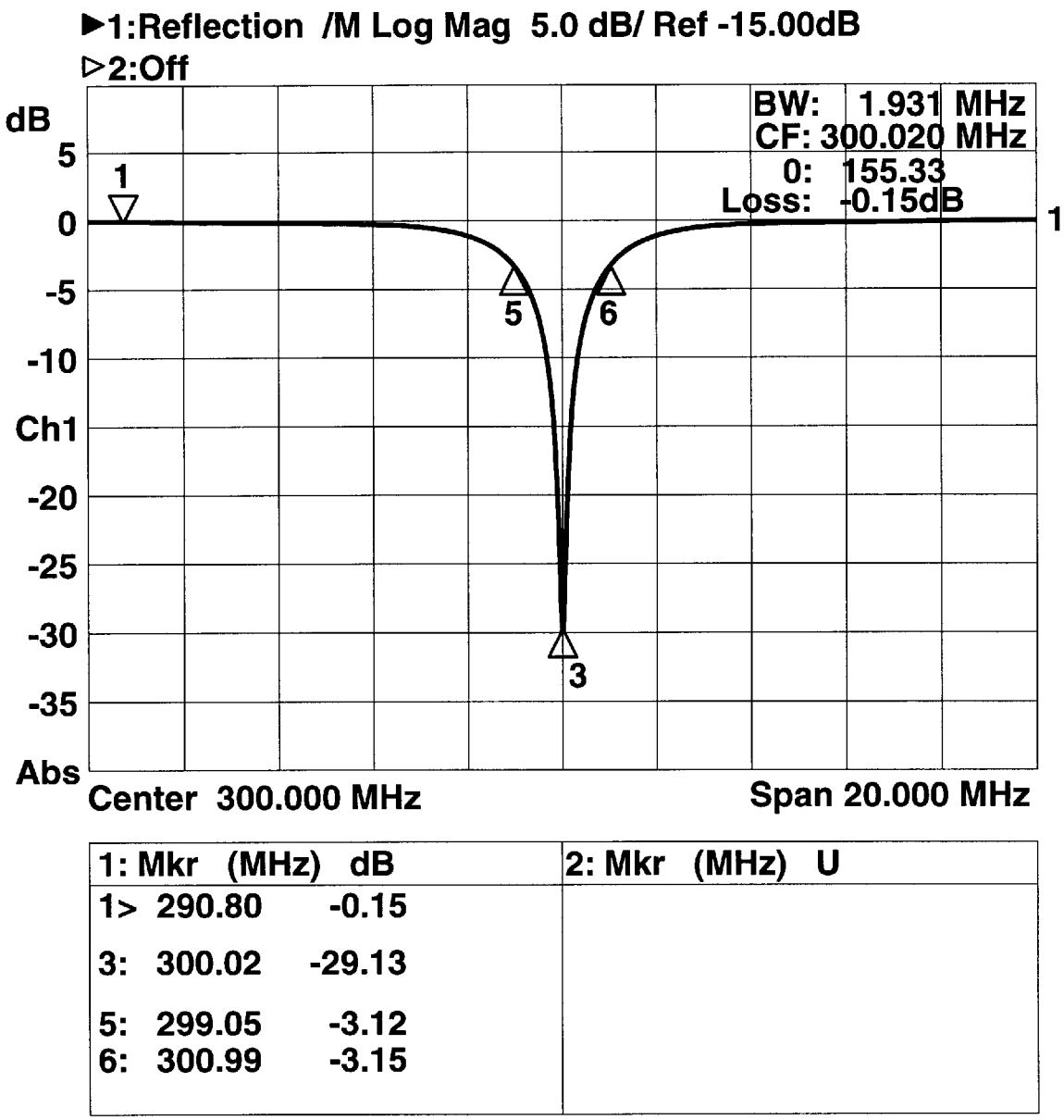
FIG. 7 shows a network analyser output from a constructed resonator according to one embodiment demonstrating the absence of modal interference.

FIG. 6b shows a 5% contour plot of the selected RF magnetic field mode in the variable resonator, demonstrating very good quality homogeneity in the centre of the resonator. FIG. 7 shows the network analyser swept field output for the resonator, tuned to 300 MHz and indicates a single high quality factor mode with no other modes in the bandwidth and therefore no modal interference is present—this demonstrates the two desirable attributes of the variable strip design—high homogeneity and distinct modal selection.

Figure 8:
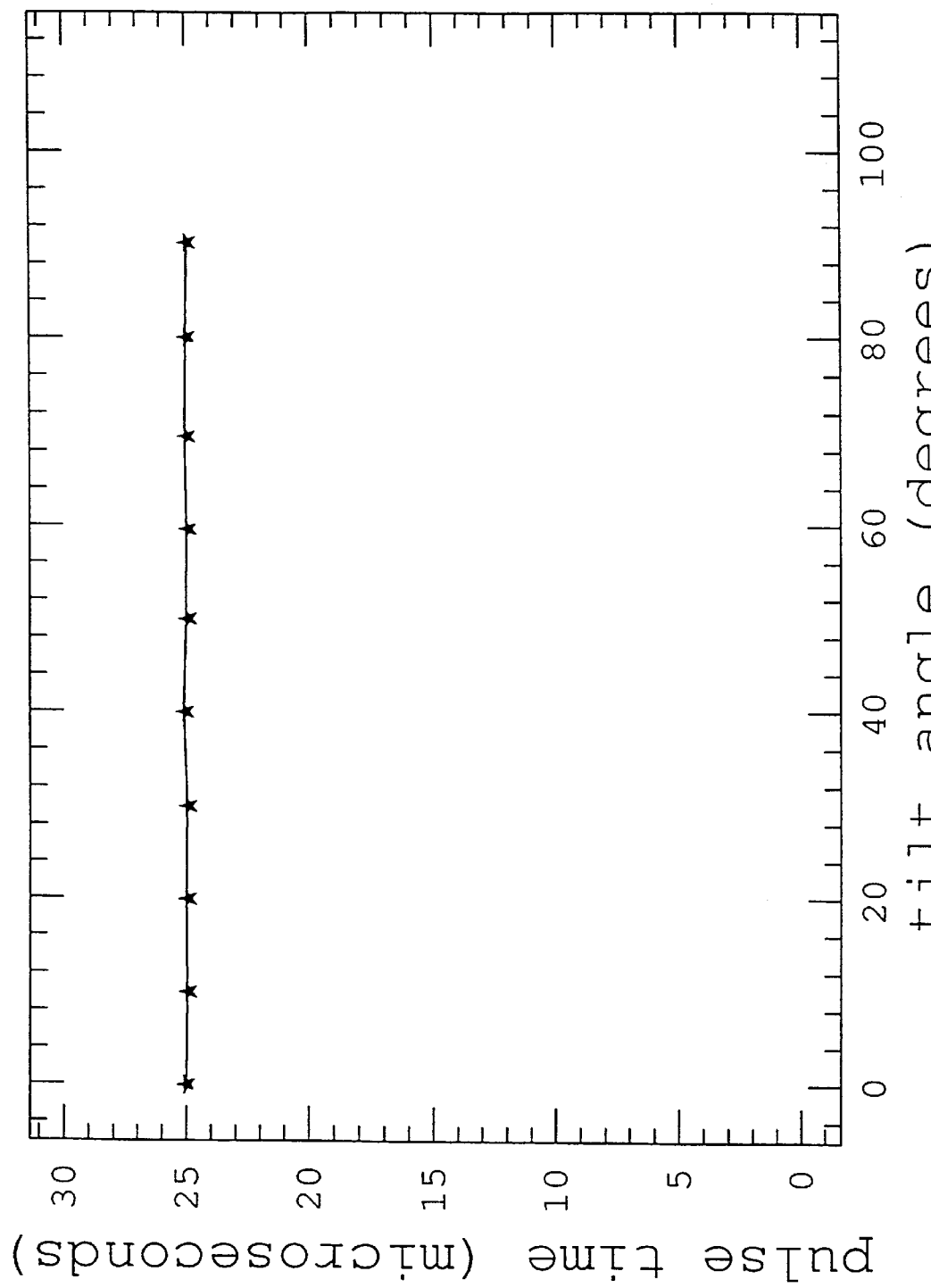
FIG. 8 shows the experimental result relating the inclination angle to the pulse time for maximum signal return in a simple pulse and collect NMR experiment.

FIG. 8 illustrates results of a series of experiments in which the 6 mm 300 MHz variable strip resonator was inclined to the $B_0$ field axis. At each inclination angle, for fixed RF amplitude input, the pulse time of a rectangular envelope RF pulse was adjusted from a very small value until the NMR signal was nulled—this is known as the 180 degree pulse time in the art and is an indicator of coil efficiency. Note from the figure that the 180 degree pulse angle was invariant with inclination angle clearly demonstrating the desired action of the invention.

In one embodiment of this invention the inclination angle is $\cos^{-1}(1/\sqrt{3})$ or about 54.7° which is well known in NMR as the "magic angle" as spinning the sample about this axis averages the effect of dipolar interactions, removes the effect of chemical shift anisotropy and therefore narrows the spectral line(s) obtained from the NMR experiment.

Figure 9:
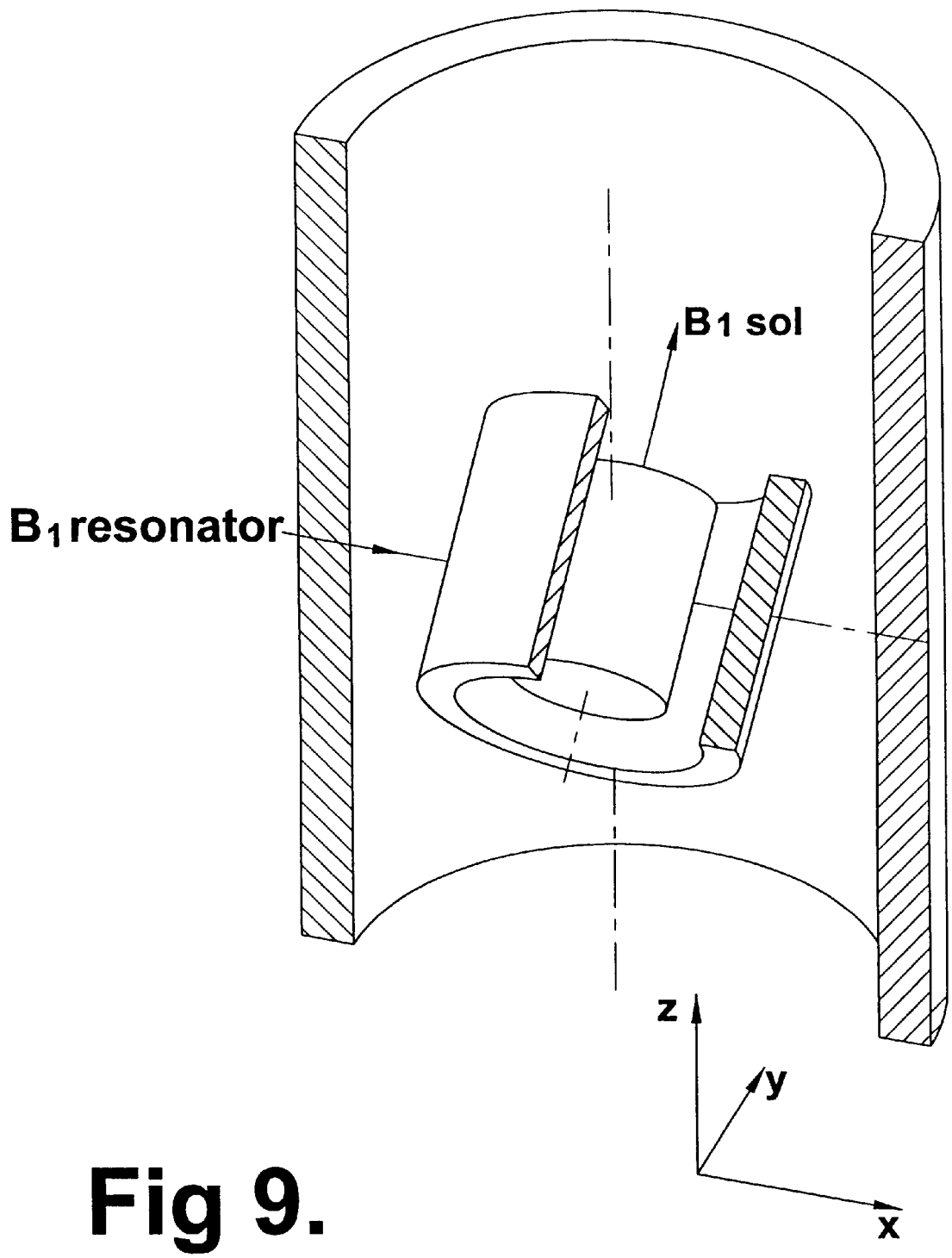
FIG. 9 illustrates the combination of the inclined resonator and a solenoid coil and demonstrates the orientation of the generated $B_1$ fields of each coil.

In another embodiment of the invention the resonator is combined with a solenoidal RF coil, such coils generate a $B_1$ field along the axis of the solenoid, by combining this coil with the resonator, two orthogonal modes are generated thereby allowing a quadrature combination and the net generation of a quadrature RF coil. FIG. 9 illustrates the structure of the combined solenoid/resonator structure and the direction of the generated $B_1$ fields.

Figure 10:
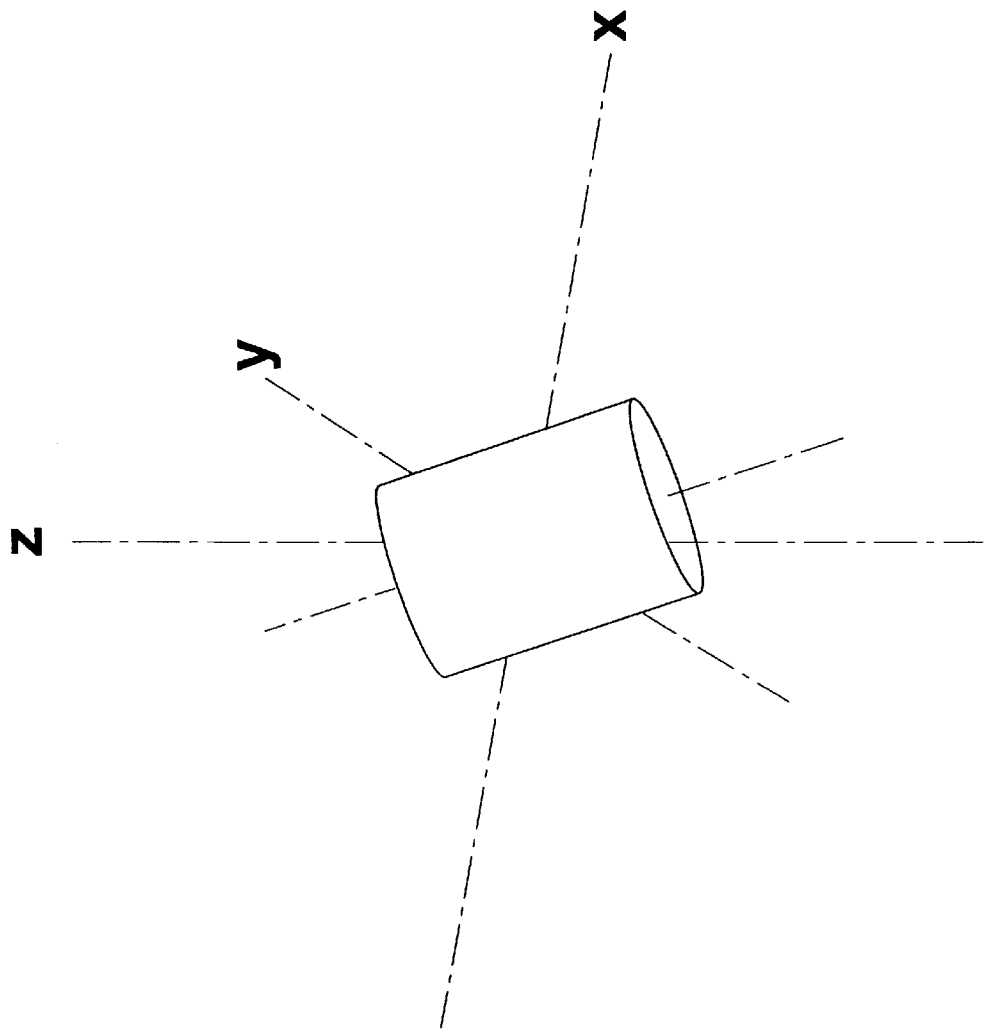
FIG. 10 illustrates how the resonator may be rotated in the transverse plane.

In a further embodiment the coil structure(s) may be rotated in the transverse plane without loss of function as shown schematically in FIG. 10.

While this invention has been described with reference to particular embodiments and examples, other modifications and variations will occur to those skilled in the art. Accordingly, it should be understood that within the scope of the following claims, the invention may be practised otherwise than is specifically claimed.

A resonator having two conducting rungs can also be used in the probehead in accordance with the invention. Such a resonator is e.g. described in a publication by Donald Alderman and David Grant, Journal of Magnetic Resonance, 36, 447–451 (1979), the complete disclosure of which is hereby incorporated by reference.

We claim:

1. An NMR probe head having a probe head axis, the probe head for insertion into a room temperature bore of an NMR spectrometer magnet, the NMR magnet providing, in a measurement region, a homogenous static magnetic field extending along the probe head axis, the probe head comprising:

a generally cylindrical casing extending along the probe head axis; and a cylindrical radio frequency (RF) bird-cage resonator disposed within said casing and oriented along a resonator axis, said resonator axis rotated through an angle relative to the probe head axis, said angle having a magnitude greater than zero degrees, said bird-cage resonator generating a linear, substantially homogenous RF magnetic field extending perpendicular to a plane containing said resonator axis and the probe head axis.

2. The probehead of claim 1, wherein said angle is adjustable.

3. The probehead of claim 1, wherein said angle is about $\cos^{-1}(1/\sqrt{3})$ degrees.

4. The probehead of claim 1, wherein the bird-cage resonator comprises at least two conducting rods around its periphery aligned parallel to said probehead axis so as to generate a standing wave of integrated current about its azimuth to produce at least one transverse linear RF mode.

5. The probehead of claim 4, wherein an operating frequency of said bird-cage resonator is 300 MHz or higher.

6. The probehead of claim 4, wherein each rung along the RF resonator has a different width to its adjacent rung, thereby producing the required current density for the generation of homogeneous transverse RF magnetic fields.

7. The probehead of claim 4, wherein said bird-cage resonator is tuned to at least two different frequencies.

8. The probehead of claim 7, wherein the RF fields generated at said at least two different frequencies have a same spatial orientation.

9. The probehead of claim 7, wherein each rung along the RF resonator has a different width to its adjacent rung, thereby producing the required current density for the generation of homogeneous transverse RF magnetic fields.

10. The probehead of claim 4, further comprising a solenoid RF coil whose solenoidal axis corresponds with said resonator axis.

11. The probe head of claim 10, wherein RF magnetic fields generated by said bird-cage resonator and by said solenoid coil are at a same frequency and, when combined, produce a circular polarized RF magnetic field.

12. The probehead of claim 4, wherein said bird-cage resonator comprises at least 4 conducting rungs.

13. The probehead of claim 4, wherein each rung is connected to its nearest neighboring rung at each axial end-point by a capacitive element so as to generate a high-pass resonant structure.

14. The probehead of claim 13, wherein said rungs are interrupted axially by capacitive elements so as to generate a band-pass resonant structure.

15. The probehead of claim 13, wherein an operating frequency of said bird-cage resonator is 300 MHz or higher.

16. The probehead of claim 4, wherein said rungs are conductively connected to their nearest neighboring rung at their axial end points and wherein said rungs are interrupted axially by a capacitive element so as to generate a low-pass resonant structure.

17. The probehead of claim 1, wherein an operating frequency of said bird-cage resonator is 300 MHz or higher.

18. The probehead of claim 1, wherein the said bird-cage resonator is tuned to at least two different frequencies.

19. The probe head of claim 1, further comprising a solenoid RF coil whose solenoid axis correspond with said resonator axis.

20. The probehead of claim 19, wherein the RF magnetic fields generated by the RF resonator and by the solenoid coil are at the same frequency and when combined produce a circularly polarized RF magnetic field.

21. The probe head of claim 19, wherein said solenoid RF coil operates at a different RF frequency then said bird-cage resonator.

22. The probehead of claim 1, wherein the probehead may be rotated about the probehead axis to any angle.

* * * * *